United States Patent
Yang et al.

(10) Patent No.: US 10,840,440 B2
(45) Date of Patent: Nov. 17, 2020

(54) METAL/DIELECTRIC/METAL HYBRID HARD MASK TO DEFINE ULTRA-LARGE HEIGHT TOP ELECTRODE FOR SUB 60NM MRAM DEVICES

(71) Applicant: Taiwan Semiconductor Manufacturing Company, Ltd., Hsinchu (TW)

(72) Inventors: Yi Yang, Fremont, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 79 days.

(21) Appl. No.: 15/902,391

(22) Filed: Feb. 22, 2018

(65) Prior Publication Data

US 2019/0259940 A1 Aug. 22, 2019

(51) Int. Cl.
*H01L 43/12* (2006.01)
*H01L 27/22* (2006.01)

(52) U.S. Cl.
CPC ............ *H01L 43/12* (2013.01); *H01L 27/222* (2013.01)

(58) Field of Classification Search
CPC combination set(s) only.
See application file for complete search history.

(56) References Cited

U.S. PATENT DOCUMENTS

| | | | |
|---|---|---|---|
| 6,806,096 B1 | 10/2004 | Kim et al. | |
| 8,975,089 B1 * | 3/2015 | Jung | H01L 43/12 257/295 |
| 9,490,424 B2 | 11/2016 | Lu | |
| 9,564,577 B1 * | 2/2017 | Hsu | H01L 43/02 |
| 9,608,200 B2 | 3/2017 | Shen et al. | |
| 2003/0180968 A1 | 9/2003 | Nallan et al. | |
| 2010/0311243 A1 | 12/2010 | Mao | |
| 2012/0028373 A1 | 2/2012 | Belen et al. | |
| 2013/0244344 A1 | 9/2013 | Malmhall et al. | |
| 2013/0267042 A1 * | 10/2013 | Satoh | H01L 27/222 438/3 |
| 2014/0098459 A1 | 4/2014 | Lee et al. | |
| 2016/0268499 A1 | 9/2016 | You et al. | |
| 2016/0351799 A1 | 12/2016 | Xue et al. | |

\* cited by examiner

*Primary Examiner* — Tony Tran
(74) *Attorney, Agent, or Firm* — Haynes and Boone, LLP

(57) ABSTRACT

An ultra-large height top electrode for MRAM is achieved by employing a novel thin metal/thick dielectric/thick metal hybrid hard mask stack. Etching parameters are chosen to etch the dielectric quickly but to have an extremely low etch rate on the metals above and underneath. Because of the protection of the large thickness of the dielectric layer, the ultra-large height metal hard mask is etched with high integrity, eventually making a large height top electrode possible.

20 Claims, 1 Drawing Sheet

METAL/DIELECTRIC/METAL HYBRID HARD MASK TO DEFINE ULTRA-LARGE HEIGHT TOP ELECTRODE FOR SUB 60NM MRAM DEVICES

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During photolithography, patterns are transferred from a photomask to a light-sensitive photoresist and later transferred to MTJ stacks by RIE, IBE or their combination, forming separate and non-interacting MTJ devices.

To have a large enough process window, a large height top electrode on top of MTJ is preferred so that any consumption during the later processes such as MTJ etch and CMP do not affect the device integrity. Moreover, people have found that while etching MTJ, the non-volatile metal re-deposition onto the junction and electrically shorted devices can be greatly reduced if one can over-etch into the bottom electrode, which again requires a large height top electrode. To define this large height top electrode, another hard mask or hard mask stack which can transfer the sub 60 nm photoresist patterns with high integrity is needed. One widely used hard mask stack in the IC industry is composed of a thin (~30 nm) silicon hard mask on top of a thick (~200-300 nm) carbon hard mask, deposited by CVD or spin-coating. Unfortunately, this stack is still not selective enough when it comes to the patterning of MRAM devices' electrode materials such as Ta and TiN with a large aspect ratio. As a result, all MRAM devices in literature have an electrode height less than 60 nm, which does not provide enough process window for the patterning of future sub 60 nm devices.

Several patents teach using more than one hard mask layer including: U.S. Pat. No. 8,975,089 (Jung et al), U.S. Pat. No. 9,490,424 (Lu), and U.S. Pat. No. 9,608,200 (Shen et al). All of these references are different from the present disclosure.

SUMMARY

It is an object of the present disclosure to provide an improved method of forming MTJ structures having a thick metal top electrode.

Yet another object of the present disclosure is to provide a method of forming MTJ structures having a thick metal top electrode by using a thick hybrid hard mask stack.

In accordance with the objectives of the present disclosure, a method for etching a magnetic tunneling junction (MTJ) structure is achieved. An ultra-large height top electrode for MRAM is achieved by employing a novel thin metal/thick dielectric/thick metal hybrid hard mask stack. Etching parameters are chosen to etch the dielectric quickly but to have an extremely low etch rate on the metals above and underneath. Because of the protection of the large thickness of the dielectric layer, the ultra-large height metal hard mask is etched with high integrity, eventually making a large height top electrode possible.

Also in accordance with the objectives of the present disclosure, a method for etching a magnetic tunneling junction (MTJ) structure is achieved. A bottom electrode is provided on a substrate. A MTJ stack is deposited on the bottom electrode. A top electrode layer having a first thickness is deposited on the MTJ stack. A hybrid hard mask is formed on the top electrode layer wherein the hybrid hard mask comprises a first dielectric mask layer having a mask thickness of more than four times the first thickness and second and third mask layers on the first dielectric mask layer. A photo resist pattern is formed on the hybrid hard mask. First, the second and third mask layers of the hybrid hard mask are etched where it is not covered by the photo resist pattern using a first etching chemistry. Second, the hybrid hard mask is etched where it is not covered by remaining second and third mask layers using a second etching chemistry. Next, the top electrode is etched where it is not covered by the remaining hybrid hard mask wherein a portion of the first dielectric mask layer remains on the patterned top electrode. Finally, the MTJ stack is etched where it is not covered by the patterned top electrode wherein overetching is performed wherein a MTJ device is formed and wherein the bottom electrode is etched into and wherein re-deposition material is formed on sidewalls of the bottom electrode underlying the MTJ device and not on sidewalls of the MTJ device and wherein the remaining top electrode has a second thickness no less than 80% of the first thickness.

BRIEF DESCRIPTION OF THE DRAWINGS

In the accompanying drawings forming a material part of this description, there is shown.

DETAILED DESCRIPTION

In this disclosure, the ultra-large height top electrode for MRAM is achieved by employing a novel thin metal/thick dielectric/thick metal hybrid hard mask stack. Specifically, we firstly transfer the photoresist pattern into the first thin layer of metal, such as Ti, TiN, Ta, or TaN, using a fluorine carbon plasma which has a high fluorine ratio such as $CF_4$ and $CHF_3$. Next, the dielectric layer such as $SiO_2$ is plasma etched by $C_4F_8$ or $CH_2F_2$ alone or mixed with Ar and $O_2$. This gas specie etches the dielectric quickly but has an extremely low etch rate on the metals above and underneath. The second thick metal layer is etched again by the same gas specie as the first thin metal layer. Because of the protection of the large thickness of the dielectric layer, the ultra-large height metal hard mask is etched with high integrity, eventually making a large height top electrode possible.

For our current process flow, the top electrode of MRAM devices is patterned by photoresist directly. The largest possible electrode height is limited by the height of the photoresist pattern which can collapse if the aspect ratio is too high. In this disclosure, we insert a novel hybrid hard mask stack with an ultra-large total thickness between the photoresist and the top electrode. By choosing the right etch gas chemistry for each layer within the stack, the sub 60 nm patterns can be transferred into the large height top electrode with high quality. The original height limit on MRAM top electrode by photolithography and plasma etch does not exist anymore. Moreover, compared to other complex hard mask stacks in the IC industry such as silicon and carbon hard masks, the materials and plasma gas species used in this hybrid hard mask stack are more common and easier to process.

Figure 1:
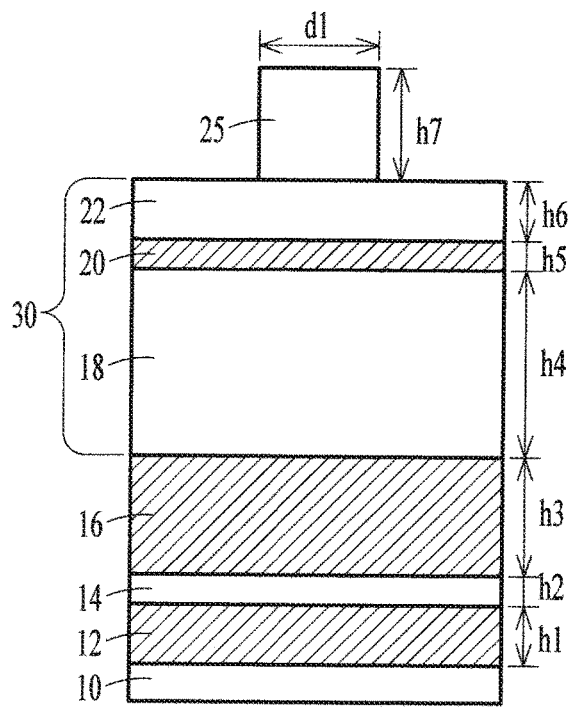
FIGS. 1 through 5 illustrate in cross-sectional representation steps in a preferred embodiment of the present disclosure.

The preferred embodiment of the present disclosure will be described in more detail with reference to FIGS. 1-5. FIG. 1 illustrates a bottom electrode layer 12 formed on a semiconductor substrate 10. Bottom electrode 12 is preferably Ti, TiN, Ta, or TaN with thickness h1 of greater than or equal to 50 nm. Next, the MTJ film layers are deposited, typically including a seed layer, a pinned layer, a barrier layer, a free layer, and a cap layer, for example. These layers form the MTJ film stack 14, having a thickness h2 of between about 10 and 30 nm.

On top of MTJ stack 14, a thick metal hard mask 16 such as Ta, Ti, TaN or TiN is deposited, preferably to a thickness h3 of greater than or equal to 100 nm. The hard mask will form the top electrode after etching is complete. Next, a hybrid hard mask stack is sequentially formed on top of the metal hard mask 16.

An ultra-thick $SiO_2$ layer 18 with thickness h4 of greater than or equal to 400 nm is deposited as a dielectric hard mask. Sequentially another thin Ti, TiN, Ta, or TaN layer 20 with thickness h5 of between about 30 and 50 nm smaller than the top electrode layer 16 underneath is deposited as the metal hard mask. Finally, a dielectric anti-reflective coating (DARC) 22 such as silicon oxynitride (SiON) or organic BARC with thickness h6 of between about 30 and 90 nm is spin-coated onto the metal hard mask layer 20. This completes the hybrid hard mask stack 30.

A photoresist pattern 25 with size d1 of between about 70 and 80 nm and thickness h7 of between about 100 and 300 nm is then patterned by photolithography on top of the hybrid hard mask stack 30.

Figure 2:
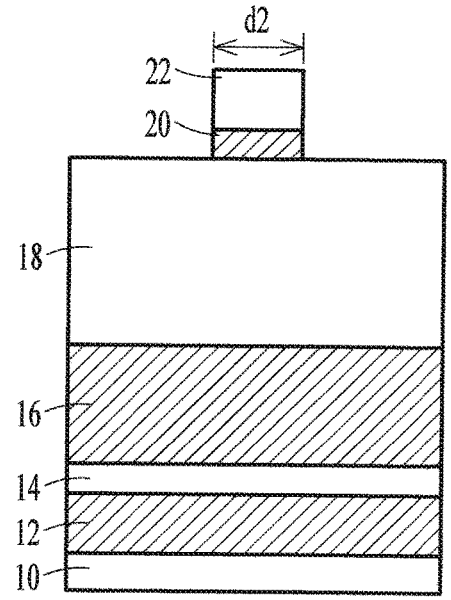

FIGS. 2-5 illustrate steps in the process of fabricating MTJ structures using hybrid hard mask 30. As shown in FIG. 2, during the first RIE etch, the DARC layer 22 and the metal layer 20 are firstly patterned by a fluorine carbon based plasma such as $CF_4$ or $CHF_3$ alone, or mixed with Ar and $N_2$. Alternatively, the first etching could be with a halogen plasma such as $Cl_2$ alone or mixed with $BCl_3$. After this first etching step, the photoresist pillar has been removed and the DARC and metal layer pillar 22/20 has a pattern size d2 of between about 60 and 70 nm. $O_2$ can be added to the etching plasma to greatly reduce the pillar size to 50 nm or below.

Figure 3:
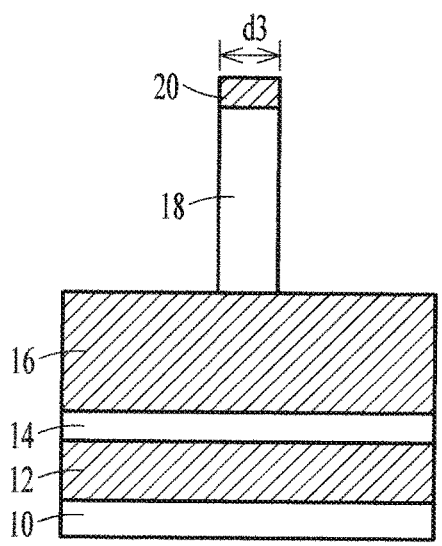

As illustrated in FIG. 3, the pattern is then transferred to the ultra-thick dielectric layer 18 by $C_4F_8$ or $CH_2F_2$ alone or mixed with Ar and/or $O_2$. The DARC mask layer 22 is removed and the resulting pillar size d3 is between about 40 and 50 nm. This gas has a very high etch rate on the dielectric but a low etch rate on the metal hard mask as summarized in Table 1. Therefore most of the top electrode metal hard mask 16 still remains after the dielectric 18 is etched.

TABLE 1

| Material | Etch Chemistry | Etch rate (A/s) | Etch selectivity |
| --- | --- | --- | --- |
| $SiO_2$ | Ar/$O_2$/$C_4F_8$ | 46 | 23:1 |
| TiN | | 2 | |

TABLE 1-continued

| Material | Etch Chemistry | Etch rate (A/s) | Etch selectivity |
| --- | --- | --- | --- |
| $SiO_2$ | $CF_4$ | 129 | 2.9:1 |
| TiN | | 45 | |

Figure 4:
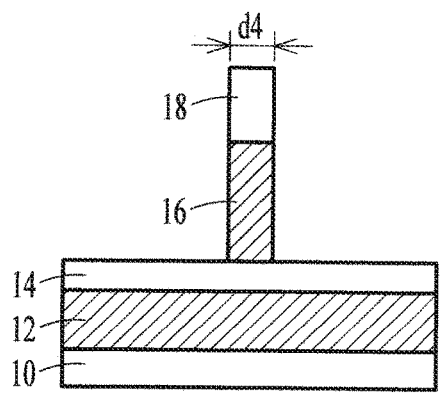

Next, as illustrated in FIG. 4, the bottom ultra-large thickness metal hard mask is etched by a fluorine carbon such as $CF_4$ or a halogen such as $Cl_2$ alone or mixed with $BCl_3$, resulting in a pillar size d4 of between about 30 and 40 nm. Although some of the dielectric layer 18 is consumed during this step, its large initial thickness ensures the integrity of the large height metal hard mask 16. Since the dielectric thickness is four times the thickness of the metal underneath, 100% of the metal hard mask 16 will remain.

Figure 5:
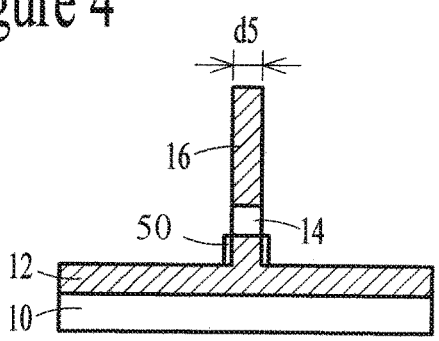

During the final MTJ etch, a great over etch is applied so that any non-volatile metal re-deposition 50 only covers the area below the MTJ, as shown in FIG. 5, reducing the shorted devices and improving the performance. The final pattern size of the MTJ d5 is between about 20 and 30 nm. Since the dielectric hard mask 18 is thick enough, the remaining top electrode height h8 should be the same or very similar to the initial deposition thickness h3 of greater than or equal to 100 nm. That is, the top electrode thickness will be at least 80% of the original thickness of the as-deposited top electrode layer, at least 80 nm for an original deposition thickness of 100 nm. This will benefit the later processes such as CMP.

The present disclosure provides a novel hybrid hard mask stack which can transfer the sub 60 nm photoresist pattern into the MTJ, with an ultra-large top electrode height of over 100 nm. With the process of the present disclosure, the original height limit on MRAM top electrodes by photolithography and plasma etch no longer exists. Consequently when serving as the hard mask for the later MTJ etching, this top electrode ensures that any consumption during this and later process steps does not affect the device integrity. It also allows for a great over etch of the MTJ, reducing the amount of metal re-deposition onto the MTJ sidewall and, thus, shorted devices. The sub 60 nm MRAM device yield and performance are improved by this new integration.

The process of the present disclosure will be used for MRAM chips of the size smaller than 60 nm, which require a larger process margin during MTJ etch and CMP processes. It will also greatly benefit from the reduced MTJ sidewall metal re-deposition due to its large edge-effect, i.e., small size devices have a relatively large sidewall ratio.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method for etching a magnetic tunneling junction (MTJ) structure comprising:
   providing a bottom electrode on a substrate;
   depositing a MTJ stack on said bottom electrode;
   depositing a top electrode layer having a first thickness on said MTJ stack;
   forming a hybrid hard mask on said top electrode layer wherein said hybrid hard mask comprises a first dielectric mask layer having a mask thickness of more than four times said first thickness and second and third mask layers on said first dielectric mask layer, wherein said first dielectric mask layer physically contacts said top electrode layer;

forming a photo resist pattern on said hybrid hard mask;

first etching second and third mask layers of said hybrid hard mask where it is not covered by said photo resist pattern using a first etching chemistry;

thereafter second etching said hybrid hard mask where it is not covered by remaining said second and third mask layers using a second etching chemistry;

thereafter etching said top electrode where it is not covered by remaining said hybrid hard mask, wherein a portion of said first dielectric mask layer remains on patterned said top electrode after said etching of said top electrode, wherein said portion of said first dielectric mask layer has a top surface that is exposed after said etching of said top electrode, said top surface of said portion of said first dielectric mask layer facing away from said substrate; and thereafter over etching said MTJ stack and said bottom electrode using said patterned top electrode and said portion of said first dielectric mask layer as a mask, wherein said over etching includes over etching said bottom electrode and said MTJ stack such that re-deposition material is formed on sidewalls of said bottom electrode and not on sidewalls of said MTJ stack, wherein remaining said top electrode has a second thickness no less than 80% of said first thickness after said etching of said MTJ stack.

2. The method of claim 1 wherein said top electrode layer comprises Ta, Ti, TaN, or TiN having said first thickness of greater than or equal to 100 nm and wherein after said etching said MTJ stack, said top electrode has said second thickness of greater than or equal to 80 nm.

3. The method of claim 1 wherein said first dielectric mask layer comprises silicon oxynitride (SiON) or silicon dioxide having a thickness of greater than or equal to 400 nm.

4. The method of claim 1 wherein said second mask layer comprises Ti, TiN, Ta, or TaN and has a thickness 30 to 50 nm smaller than said first thickness of said top electrode layer.

5. The method of claim 1 wherein said third mask layer comprises SiON having a thickness of between about 30 and 90 nm.

6. The method of claim 1 wherein said first etching comprises etching with a fluorine carbon based plasma which has a low carbon to fluorine ratio alone or mixed with Ar and $N_2$.

7. The method of claim 1 wherein said second etching comprises etching with $C_4F_8$ or $CH_2F_2$ alone or mixed with Ar and/or $O_2$.

8. The method of claim 1 wherein said etching said top electrode layer comprises etching with $CF_4$, $CHF_3$, $Cl_2$, or $Cl_2$ mixed with $BCl_3$.

9. The method of claim 1, wherein said portion of said first dielectric mask layer is removed during said etching of said MTJ stack.

10. The method of claim 1, wherein a first portion of a top surface of said bottom electrode is exposed after said etching of said MTJ stack.

11. The method of claim 10, wherein said re-deposition material is further formed on a second portion of said top surface of said bottom electrode, said top surface of said bottom electrode facing away from said substrate.

12. The method of claim 1, wherein said second mask layer includes a metal material, and
wherein said third mask layer includes a dielectric material.

13. The method of claim 1, wherein said top electrode layer includes a material selected from the group consisting of Ta, Ti, TaN, and TiN,
wherein said first dielectric mask layer includes a material selected from the group consisting of silicon oxynitride (SiON) and silicon dioxide,
wherein said second mask layer includes a material selected from the group consisting of Ti, TiN, Ta, and TaN, and
wherein said third mask layer includes SiON.

14. The method of claim 1, wherein said first etching of said second and third mask includes performing a reactive ion etching process.

15. The method of claim 1, wherein a top surface of said top electrode layer is exposed after said second etching of said hybrid hard mask.

16. The method of claim 1, wherein said substrate includes a semiconductor substrate.

17. The method of claim 1, wherein said forming of said hybrid hard mask on said top electrode layer includes forming said hybrid mask directly on said top electrode layer such that said hybrid hard mask physically contacts said top electrode layer.

18. The method of claim 1, wherein said second mask layer physically contacts sad first dielectric mask layer, and
wherein said third mask layer physically contacts said second mask layer.

19. The method of claim 1, wherein said first etching of said second and third mask layers includes etching with a fluorine carbon based plasma.

20. The method of claim 1, wherein said first etching of said second and third mask layers includes etching with a halogen based plasma.

* * * * *